(12) United States Patent
Norris et al.

(10) Patent No.: US 7,231,004 B2
(45) Date of Patent: Jun. 12, 2007

(54) SYSTEM AND METHOD OF LOW POWER DEMODULATION OF CONTINUOUS PHASE MODULATED WAVEFORMS

(75) Inventors: James Anthony Norris, Fairport, NY (US); Clifford Hessel, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 767 days.

(21) Appl. No.: 10/418,214

(22) Filed: Apr. 18, 2003

(65) Prior Publication Data

US 2004/0208264 A1   Oct. 21, 2004

(51) Int. Cl.
  *H03D 1/00*  (2006.01)
  *H04L 27/06* (2006.01)
(52) U.S. Cl. .................................... 375/340; 375/324
(58) Field of Classification Search ............... 375/340, 375/324
See application file for complete search history.

(56) References Cited

U.S. PATENT DOCUMENTS

| | | | |
|---|---|---|---|
| 3,818,355 A * | 6/1974 | Ishigaki | 329/342 |
| 4,539,524 A | 9/1985 | Goode | |
| 4,727,580 A * | 2/1988 | Sakai | 381/7 |
| 4,926,440 A * | 5/1990 | Mikoshiba et al. | 375/145 |
| 5,170,131 A | 12/1992 | Takahiro et al. | |
| 5,808,509 A * | 9/1998 | Baltus et al. | 329/300 |
| 5,949,827 A | 9/1999 | DeLuca et al. | |
| 6,985,541 B1 * | 1/2006 | Luff | 375/324 |

OTHER PUBLICATIONS

Christian Halper, Michael Heiss, and Georg Brasseur, "Digital- to-Analog Conversion by Pulse-Count Modulation Methods" IEEE Transactions on Instrumentations and Measurement, vol. 45, No. 4, Aug. 1996.*
Asano, D.K., Leib, H., & Pasupathy, S., "Phase Smoothing Functions for Continuous Phase Modulation," IEEE Trans. on Signal Processing, vol. 42, No. 2/3/4, Feb./Mar./Apr. 1994.
Aulin, T., Rydbec, N., & Sundberg, C.-E., "Continuous Phase Modulation-Part II: Partial Response Signaling," IEEE Trans. on Communications, vol. COM-29, No. 3, Mar. 1981.
Colavolpe, G. and Raheli, R., "Reduced-Complexity Detection and Phase Synchronization of CPM Signals," IEEE Transactions on Communications, vol. 45, No. 9, Sep. 1997.
Norris, J.A., "Low Power Method for Demodulation of Continuous Phase Modulated Waveforms," MILCOM2002, Oct. 7, 2002.

* cited by examiner

*Primary Examiner*—Jean B. Corrielus
*Assistant Examiner*—Nader Bolourchi
(74) *Attorney, Agent, or Firm*—Duane Morris LLP

(57) ABSTRACT

A radio system demodulates a continuous phase modulation waveform with a pulse count demodulator. The use of a pulse count demodulator reduces the receiver complexity and reduces power consumption, which makes such a system well suited for hand held or mobile units. The pulse count demodulator delays the CPM signal by a time increment $t_0$, and subtracts the delayed signal from the original signal creating a difference signal. The difference signal is rectified and low pass filtered resulting in an average signal representing the phase change. In non-square wave CPM signals, the signal is first clipped removing the amplitude information.

12 Claims, 4 Drawing Sheets

SYSTEM AND METHOD OF LOW POWER DEMODULATION OF CONTINUOUS PHASE MODULATED WAVEFORMS

BACKGROUND

Rapidly growing markets for wireless voice, data, and multimedia services, as well as expanding applications, will place severe demands upon radio frequency spectrum in the next few years. In order to meet the projected demand, physical layer communications equipment will require higher bandwidth efficiency than is achievable today. In addition, it is expected that the cost and power consumption of mobile equipment will remain at least where they are today, these features being particularly important in hand held radios, where size and power supplies are limited.

Quadrature amplitude modulation("QAM") may be used to address the need for high spectral efficiency but the envelope of the transmitted signal is not constant and its use with non linear (low cost) power amplifiers opens up problems of spectral regrowth, adjacent channel interference, and intersymbol interference. When used with non-linear power amplifiers QAM is sometimes used with the predistortion-based amplifier linearization (at the transmitter) and equalization (at the receiver) however both increase cost and power consumption. A known approach is to avoid the nonlinearity by using a continuous phase modulation waveform ("CPM") which allows the transmission of many bits per symbol while maintaining a constant envelope suitable for linear and non-linear amplification. Constant envelope waveforms such a CPM are ideally suited for high efficiency, low power amplifiers because of the negligible peak to average ratio that allows non-linear amplifiers to be used for this application.

In many lower power communication systems compromises are made reducing the size of the power amplifier and minimizing waveform complexity. It is desired that many existing waveforms be extended across all of the various radio platforms from high power high frequency transmitters to low power handheld radios. Traditionally, the size of the handheld radio has limited its ultimate power output and receiver complexity.

CPM waveforms are typically demodulated in super heterodyne receivers. Super heterodyne receivers require the signal to be within a certain dynamic range, to this end they employ automatic gain controllers ("AGC") which consumes physical space and power within the receiver. Such receivers also must utilize fast analog to digital converters ("ADC") which can limit the symbol rate of the received signal and also consume limited physical space and power.

Embodiments of the present invention, as an alternative to prior art systems, use a pulse count demodulator ("PCD") for CPM waveform demodulation and information extraction. While pulse count demodulation has been used for FM voice and non-coherent binary frequency shift keyed systems they have not previously been applied to CPM waveforms. The embodiments of the present invention apply in a coherent system where the incoming frequency samples are reinterpreted and integrated to provide a large performance gain associated with CPM waveforms.

Thus the pulse count demodulator according to embodiments of the present invention is ideal for the handheld environment, many single chip solutions are available and pulse count demodulators do not require automatic gain control circuits to provide dynamic range or fast ADCs anywhere in the receive path. This results in a decrease in size, cost and power requirements of the RF portion of the receiver while maintaining the advantages attributed to CPM waveforms. Hand held radio receivers for square wave CPM waveforms in the UHF frequency band as specified in MIL-STD-188-181B, incorporated by reference herein, and used predominately in military systems are especially suitable for employing a pulse count demodulator as described in the embodiments herein. An article entitled "Low Power Method for demodulation of continuous Phase Modulated waveforms." MILCOM2002, Oct. 7, 2002, by the inventor presents simulated results of a PCD with CPM wave forms. The contents of which are hereby incorporated by reference.

For these and other reasons it is an object of the present invention to provide a novel improvement to a mobile radio receiver for receiving a continuous phase modulation CPM waveform containing information symbols. For a mobile radio receiver comprising a super heterodyne demodulator, an automatic gain controller and a high rate analog to digital converter, one embodiment of the present invention replaces the super heterodyne demodulator, AGC and ADC with a pulse count demodulator for demodulating the CPM waveform to extract the information symbols.

It is also an object of the present invention to provide a novel hand held radio system with a limited power supply for receiving information from a continuous phase modulation waveform signal. One embodiment of the present invention comprises a hand held radio system including a delay circuit delaying the CPM signal by a time increment $t_0$ and a subtractor creating a difference from the CPM signal and the delayed CPM signal. The radio system also includes a half-wave rectifier for rectifying the difference and a low pass filter integrating the rectified difference to obtain an average signal. Where the amplitude of the average signal represents a phase change from which received information can be extracted.

It is still an object of the present invention to provide a novel low power method of demodulating a constant envelope waveform signal. Embodiments of the method include the steps of providing a constant envelope waveform signal containing information symbols, clipping the constant envelope waveform to create a square wave signal, and delaying the square wave signal in a delay circuit to obtain a time-delayed square wave signal. The time-delayed square wave signal is subtracted from the square wave signal to create a difference signal. The embodiments also include rectifying the difference signal to create a half wave rectified signal, integrating the rectified signal to create an average signal, and extracting the information symbols from the constant envelope waveform based on the amplitude of the average signal.

It is yet another object of the present invention to provide an improved method of demodulating a constant envelope waveform encoded with information symbols. An embodiment of the present invention includes the step of demodulating the constant envelope waveform with a pulse count demodulator to extract the information symbols.

These and many other objects and advantages of the present invention will be readily apparent to one skilled in the art to which the invention pertains from a perusal or the claims, the appended drawings, and the following detailed description of the preferred embodiments

DETAILED DESCRIPTION

Before proceeding with the detailed description, the relationship between phase and frequency in regards to embodiments of the present invention is described to avoid confusion as these terms are used somewhat interchangeably throughout the description. As is known in the art, frequency is defined as a change in phase of a sinusoid per unit time. Since CPM waveforms travel directly from one phase constellation position to another constellation position at a constant rate, the use of frequency to describe the travel from one constellation position to another is interchangeable with the use of the phase as long as the starting phase (or ending phase) is used in the description.

The pulse count demodulation used in embodiments of the present invention is described below in detail. Generally, the intermediate frequency signal ("IF") in the receive radio is clipped and, based on the desired signal bandwidth, the clipped signal is delayed and subtracted from itself to form pulses which have a duration equal to the delay period. The signal is rectified and low pass filtered which acts as an integration.

Figure 1:
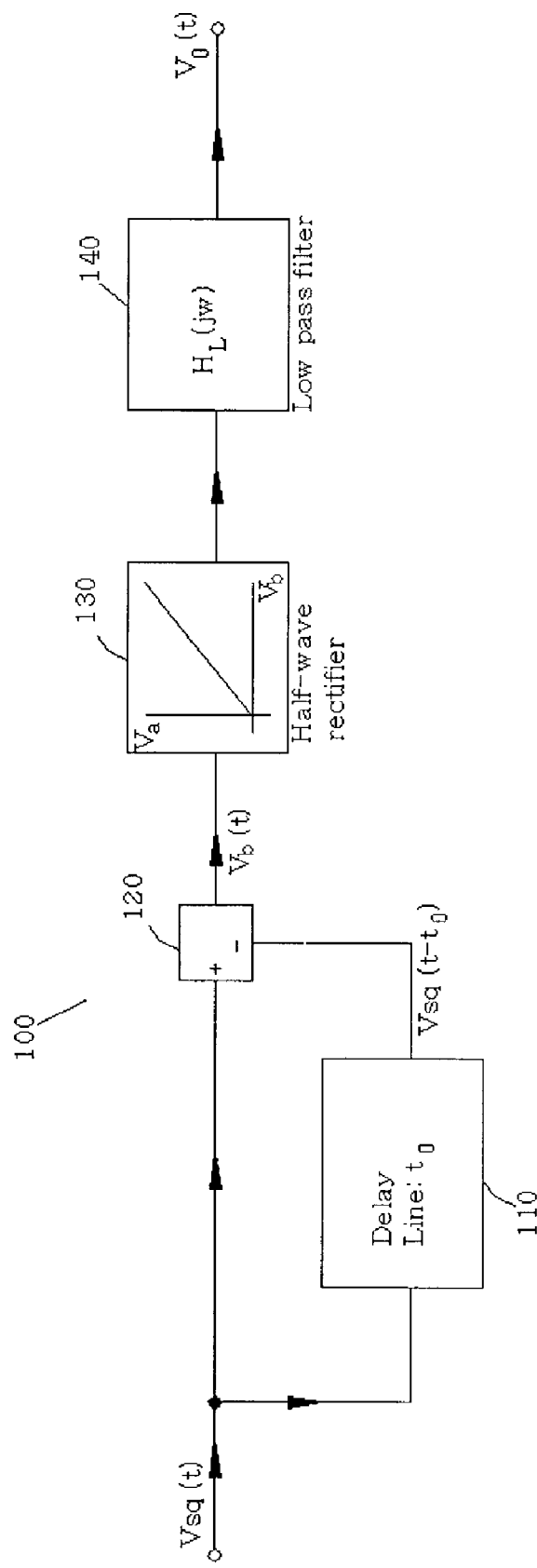
FIG. 1 is a schematic diagram of a pulse count demodulator.
Figure 2:
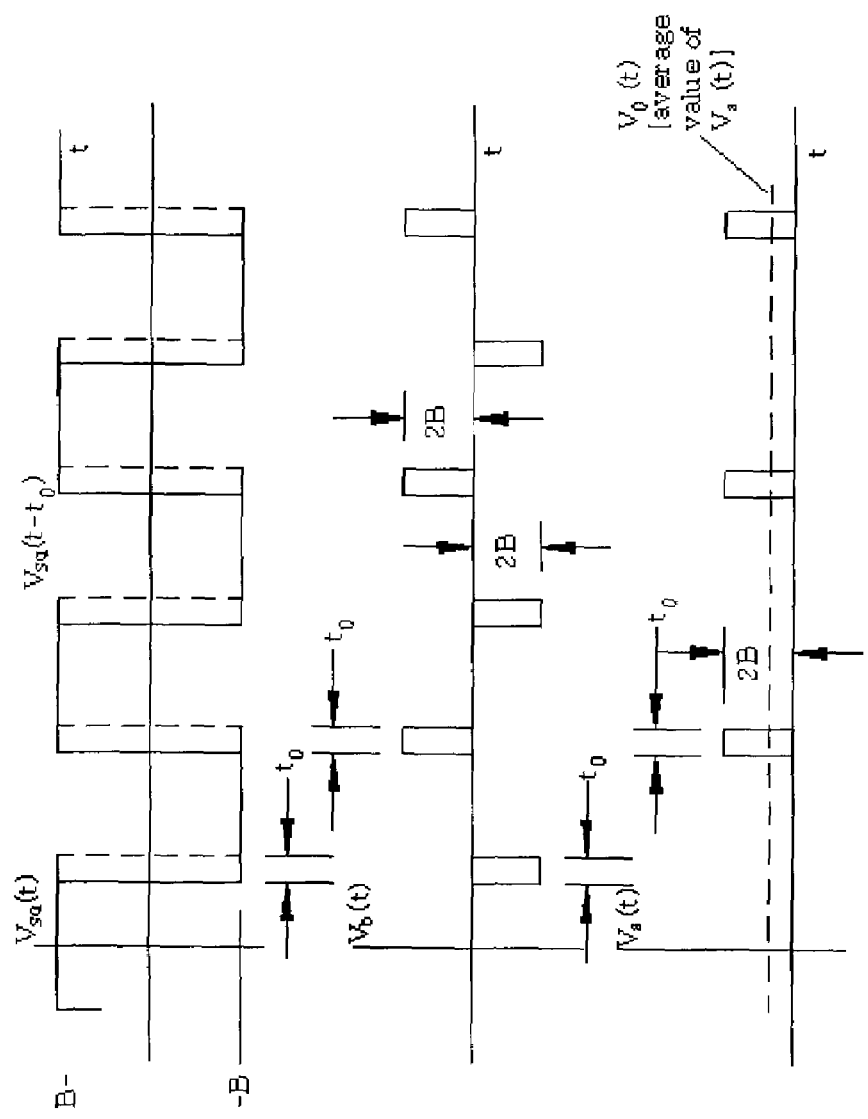
FIG. 2 is a representation of the output signals at portions of the pulse count demodulator of FIG. 1.

A pulse count frequency demodulator is a time-delay frequency demodulator for which the time delay network may be a physical delay line, however other types of delay mechanism, circuits or software known to those of skill in the art are not precluded by the present invention. The amplitude demodulator is an average envelope detector, and the input signal is a hard-limited (clipped) square wave. The basic block diagram of a pulse count demodulator is shown in FIG. 1. A clipped IF signal $v_{sq}(t)$ is supplied to a delay circuit 110 and an subtractor 120. The subtractor 120 combines the delayed signal $v_{sq}(t-t_0)$ and the signal $v_{sq}(t)$ forming the difference signal $v_b(t)$. The difference signal is rectified by a half-wave rectifier 130 producing rectified signal $v_\omega(t)$ which is integrated in a low pass filter 140 to produce $v_0(t)$. FIG. 2, illustrates the waveforms of the signals appearing at the various points of the block diagram. From FIG. 2 it is observed that a pulse of duration $t_0$ is generated in $v_a(t)$ at each positive zero crossing of $v_{sq}(t)$ and then average (or counted) by the low pass filter to obtain $v_0(t)$. When the instantaneous frequency is high, the pulses of $v_a(t)$ are closely spaced and the average value (the low-frequency component) of the pulses at the low pass filter output is high. Similarly, as the instantaneous frequency decreases, the pulses of $v_a(t)$ become more widely spaced and the low pass filter output decreases. Thus the low pass filter provides an output which is proportional to the instantaneous frequency.

For slowly varying $\omega_i(t)$ of f(t), the constant of proportionality between $v_0(t)$ and $\omega_i(t)$ can readily be determined by letting $\omega_i(t)=\omega$(a constant). For FIG. 2, $v_a(t)$ is a periodic train of pulses with an amplitude 2B, with a duration $t_0$, with a period $2\pi/\omega$, and thus with an average value $Bt_0\omega/\pi$. Therefore, $v_0(t)=Bt_0\omega/\pi \cdot H_L(0)$ where $H_L(0)$ is the DC transfer function of the low pass filter.

Figure 3:
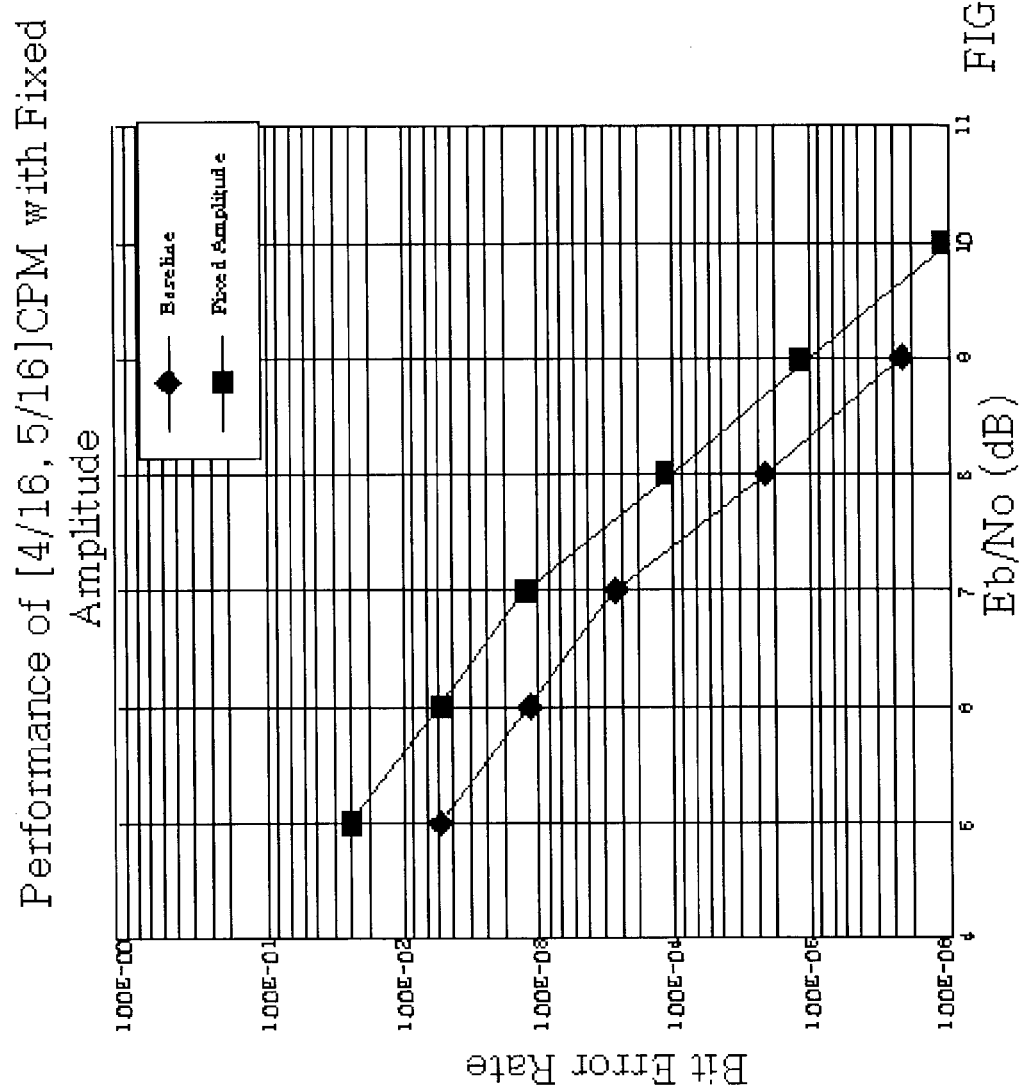
FIG. 3 is representation of the performance of a CPM with a fixed amplitude compared to a baseline.

A possible limitation of the PCD method as described above is that the signal is stripped of all amplitude information as a result of the clipping. FIG. 3 is a comparison of a standard [4/16, 5/16] CPM bit Error Rate curve. In simulation, a standard CPM demodulation method was utilized and modified by replacing the input of the correlation process of the branch metric calculation portion of the Viterbi Algorithm with inphase and quadrature components of fixed amplitude, thus simulating the clipped nature of the CPM demodulator of embodiments of the present invention. The performance degradation is limited to approximately 1 dB as shown in FIG. 3. This performance degradation is limited to the signal to noise ratio variance that is caused by re-normalizing the signal amplitude after noise has been added.

The CPM waveform has a phase trellis that is largely unaffected by instantaneous, infrequent phase changes. One major concern of differential frequency demodulation is that noise may cause the differential process to insert phase "clicks" in the receive signal stream. The phase clicks are caused by 360 degree phase shifts. The CPM trellis structure allows for some ambiguity in phase angle. The receiver uses a phase tracker that removes the phase error and the bit errors which result from the phase error. The phase tracker removes the error and aligns on the correct, transmitted phase and frequency. In the event the phase error is not removed, the worst case bit error rate occurs when a $\pi/16$ error is present in the transmitted signal. Any other rotational value will have lower bit error rates with integer multiple of $\pi/16$ phase error as the repetitive pattern. Multiples of $\pi/8$ have no additional bit error due to phase rotation.

Typically the 'h' values are a fraction of a cycle during a symbol period, so the number of IF mixer frequency cycles do not vary during one symbol period of the CPM waveform. For example, for an "h" value of 4/16, the CPM waveform will traverse (worst case) 3*4/32 of a cycle in one symbol period. When an IF mixer frequency is complex combined by the CPM signal during one symbol period, the number of zero crossings of the result is unchanged. However, each individual IF pulse duration will gradually increase during the symbol period. The average of the energy output of the PCD will increase due to the mixing with the CPM signal in direct proportion of the frequency deviation of the signal. Thus the combination of "h" value and 4-ary message bits appear as 4 voltage levels at the output of the PCD representing 4 frequency values, as seen in FIG. 4.

Figure 4:
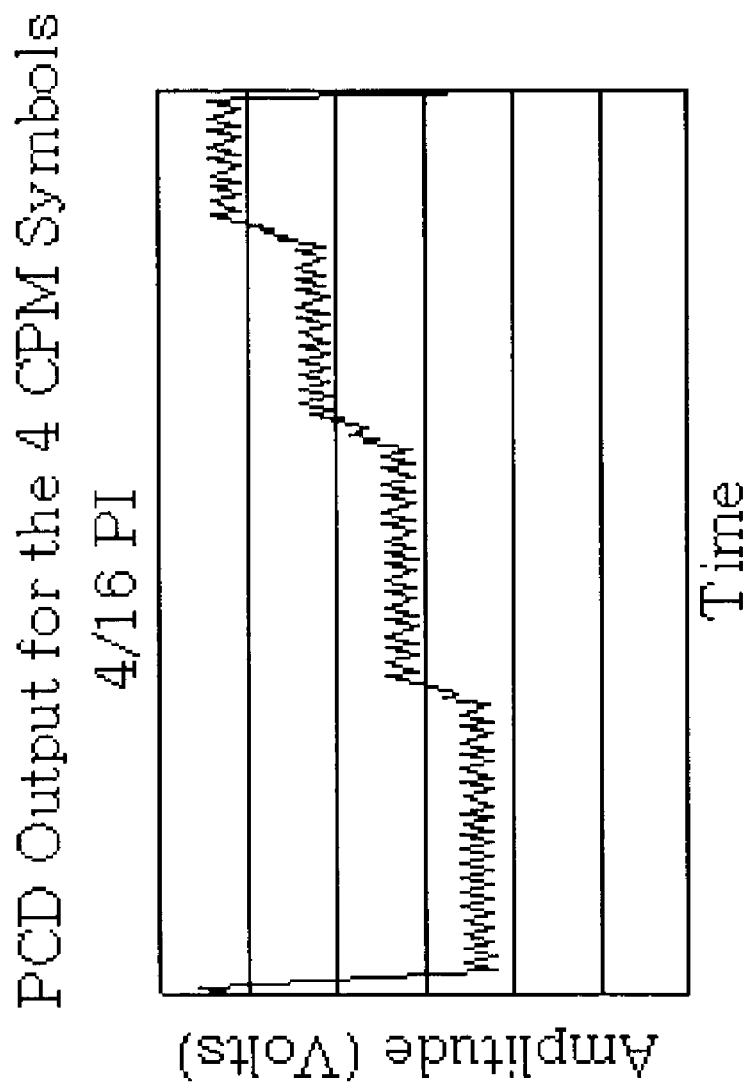
FIG. 4 is a representation of the PCD output for four CPM symbols in a 4-ary alphabet.

FIG. 4 is a representation of the PCD output for a fixed message pattern which exercised all four CPM symbols (−3*h, −h, +h, +3*h, where h=4/16) for a 4-ary alphabet. FIG. 4 also demonstrates that the output of the pulse count demodulator is proportional to the number of pulses and inversely proportional to the integration time (1 CPM symbol period). The relationship is shown as:

$$(2 \cdot \text{IF frequency}) \cdot (2 \cdot t_0) \cdot (H(0) \cdot x(t)) \Leftrightarrow m(t) \cdot h$$

For the exemplary output shown in FIG. 4, the IF frequency is 12, $t_0$ is the pulse width, and H(0) is the DC response of the integration filter. It can be seen from the relationship that the IF doubles when it is rectified and the pulse height doubles when the difference is made at $t_0$ intervals. The frequencies x(t), which are demodulated through the pulse count demodulator are scaled by these design factors and correlate to the CPM phase parameters m(t) (the message symbol) and h(the frequency deviation). Analog filters in the implementation may have a variable dc offset which force the implementation to perform the calibration of the received data.

There are many choices on the best method of calibration to employ. Calibration can be performed on a preamble or training sequence. The calibration parameters are unlikely to change during the message reception and the preamble may be long enough to accurately determine the slope and intercept of the line that will transform the voltage output of the PCD into the frequency input for CPM demodulation. In the case of FSK demodulation, the receiver makes a hard decision on each voltage level output of the pulse count demodulator and converts that data into a bit. Another calibration option would be to use that method to continuously calculate the error between the received voltage and one of the expected voltages and modify each value by the new calibration factor. Such a system would improve the calibration as the message is received. One other method to calibrate the PCD output is to reconstruct the CPM phase constellation and use the data from the CPM demodulation to correct the phase position using a phase lock loop.

Demodulation of CPM signals requires a correlation process to determine the branch metric portion of the Viterbi algorithm. Using the calibrated frequency values from the pulse count demodulator, the phase constellation can be recreated by starting at a specific phase angle. Each frequency would then indicate the procession from one phase angle to the next. The samples, which describe the constellation arc, would then be used in the correlation and branch metric computation.

An embodiment of the inventive method of demodulating the CPM waveform requires a SNR greater than 0 dB. The clipping and difference circuits of the pulse count demodulator will capture any undesired signal or noise rather than the desired signal if the undesired signal is larger in amplitude than the desired signal. The clipping required for the PCD also is a non-linear method that can decrease the signal to noise ratio of the system. If the voltage into the clipping circuit is too great, the signal could be clipped and the noise would be largely unaffected.

Since the signals are stripped of their amplitude in the clipping processes there is no need for an automatic gain controller and similarly the calibration and low pass filter eliminate the need for an ADC in the receive path of the hand held radio, reducing the structure and power consumption.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A hand held radio system with a limited power supply for receiving information from a continuous phase modulation (CPM) waveform signal comprising:
    a delay circuit delaying the CPM signal by a time increment $t_0$;
    a subtractor creating a difference from the CPM signal and the delayed CPM signal;
    a half-wave rectifier for rectifying the difference; and
    a low pass filter integrating the rectified difference to obtain an average signal,
    wherein the amplitude of the average signal represents a phase change.

2. The hand held radio system according to claim 1, further comprising a pulse forming circuit for forming square wave signals, wherein said pulse forming circuit is upstream of the delay circuit.

3. The hand held radio system according to claim 1, further comprising a calibration circuit for adjusting the impulse response of the low pass filter based on a training sequence.

4. The hand held radio system according to claim 1, further comprising a calibration circuit for adjusting the impulse response of the low pass filter based on the expected amplitude of the average signal.

5. The hand held radio system according to claim 1, wherein the radio system is a coherent FSK system.

6. The hand held radio system according to claim 1, further comprising a calibration circuit for adjusting the impulse response of the low pass filter with a phase locked loop.

7. A method of low power demodulation of a constant envelope waveform signal comprising the steps of:
    providing a constant envelop waveform signal containing information symbols;
    clipping the constant envelope waveform to create a square wave signal;
    delaying the square wave signal in a delay circuit to obtain a time delayed square signal;
    subtracting the time delayed square signal from the square wave signal to create a difference signal;
    rectifying the difference signal to create a half wave rectified signal;
    integrating the rectified signal to create an average signal; and,
    extracting the information symbols from the constant envelope waveform based on the amplitude of the average signal.

8. The method of claim 7, where the step of integrating the rectified signal further comprises the step of calibrating the average signal.

9. The method of claim 8, wherein the step of calibrating the average signal comprises the step of selecting a calibration value based on an average signal value from a known training signal.

10. The method of claim 7, wherein the constant envelope waveform is a Continuous Phase Modulation waveform.

11. The method of claim 7, wherein the constant envelope waveform has a SNR greater than 0 dB.

12. The method of claim 8 wherein the step of calibrating is accomplished with a phase locked loop.

* * * * *